United States Patent
Dong et al.

(10) Patent No.: US 12,027,195 B2
(45) Date of Patent: Jul. 2, 2024

(54) MEMORY DEVICE TRAINING

(71) Applicant: Micron Technology, Inc., Boise, ID (US)

(72) Inventors: Qi Dong, Shanghai (CN); Xuesong Li, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 135 days.

(21) Appl. No.: 17/863,196

(22) Filed: Jul. 12, 2022

(65) Prior Publication Data

US 2024/0021235 A1 Jan. 18, 2024

(51) Int. Cl.
*G11C 11/40* (2006.01)
*G11C 11/4072* (2006.01)
*G11C 11/4074* (2006.01)
*G11C 11/4096* (2006.01)

(52) U.S. Cl.
CPC ...... *G11C 11/4072* (2013.01); *G11C 11/4074* (2013.01); *G11C 11/4096* (2013.01)

(58) Field of Classification Search
CPC ............ G11C 11/4072; G11C 11/4074; G11C 11/4096
See application file for complete search history.

(56) References Cited

U.S. PATENT DOCUMENTS

| 7,974,141 B2 | 7/2011 | Fox et al. | |
| 9,514,802 B2 | 12/2016 | Guz et al. | |
| 10,810,078 B2 | 10/2020 | Hsieh et al. | |
| 2008/0122478 A1* | 5/2008 | Mei | G11C 7/04 323/272 |
| 2014/0032826 A1 | 1/2014 | Lee et al. | |
| 2018/0204773 A1 | 7/2018 | Jeong et al. | |
| 2018/0375692 A1* | 12/2018 | Wieduwilt | G11C 29/025 |
| 2021/0004241 A1 | 1/2021 | Banik et al. | |
| 2021/0149423 A1* | 5/2021 | He | G11C 7/1057 |
| 2022/0238149 A1* | 7/2022 | Hsieh | G11C 29/028 |

* cited by examiner

*Primary Examiner* — Xiaochun L Chen
(74) *Attorney, Agent, or Firm* — Brooks, Cameron & Huebsch, PLLC

(57) ABSTRACT

Methods, apparatuses, and non-transitory machine-readable media associated with a memory device training are described. An apparatus for memory device training can include a memory device and a processing device communicatively coupled to the memory device. The processing device can be configured to perform a plurality of training rounds associated with performance of the memory device at different temperatures and different voltages and write results of the plurality of training rounds to a plurality of mode registers of the memory device. The processing device can also be configured to log an initial group identifier into a current GID MR as a reference identifier and in response to a threshold deviation from the reference ID or in response to lack of deviation outside the threshold for a threshold amount of time, retrieve an updated training setting from the results in the plurality of mode registers and enable the updated training setting.

20 Claims, 6 Drawing Sheets

| 320 | TEMPERATURE (°C) | | | | | | | | |
|---|---|---|---|---|---|---|---|---|---|
| | -40 | -20 | 0 | 20 | 40 | 60 | 80 | 100 | 120 |
| 1.01 | G11 | G12 | G13 | G14 | G15 | G16 | G17 | G18 | G19 |
| 1.03 | G21 | G22 | G23 | G24 | G25 | G26 | G27 | G28 | G29 |
| 1.05 | G31 | G32 | G33 | G34 | G35 | G36 | G37 | G38 | G39 |
| 1.07 | G41 | G42 | G43 | G44 | G45 | G46 | G47 | G48 | G49 |
| 1.09 | G51 | G52 | G53 | G54 | G55 | G56 | G57 | G58 | G59 |
| 1.11 | G61 | G62 | G63 | G64 | G65 | G66 | G67 | G68 | G69 |

(Left axis label: VDD2, 322)

FIG. 3

MEMORY DEVICE TRAINING

TECHNICAL FIELD

The present disclosure relates generally to apparatuses and methods associated with memory device training.

BACKGROUND

Memory devices are typically provided as internal, semiconductor, integrated circuits in computers or other electronic systems. There are many different types of memory, including volatile and non-volatile memory. Volatile memory can require power to maintain its data (e.g., host data, error data, etc.). Volatile memory can include random access memory (RAM), dynamic random-access memory (DRAM), static random-access memory (SRAM), synchronous dynamic random-access memory (SDRAM), and thyristor random access memory (TRAM), among other types. Non-volatile memory can provide persistent data by retaining stored data when not powered. Non-volatile memory can include NAND flash memory, NOR flash memory, and resistance variable memory, such as phase change random access memory (PCRAM) and resistive random-access memory (RRAM), ferroelectric random-access memory (FeRAM), and magnetoresistive random access memory (MRAM), such as spin torque transfer random access memory (STT RAM), among other types.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

BRIEF DESCRIPTION OF THE DRAWINGS

FIG. 3 is a chart representing example group identifiers used in memory device training in accordance with a number of embodiments of the present disclosure.

DETAILED DESCRIPTION

Figure 1:
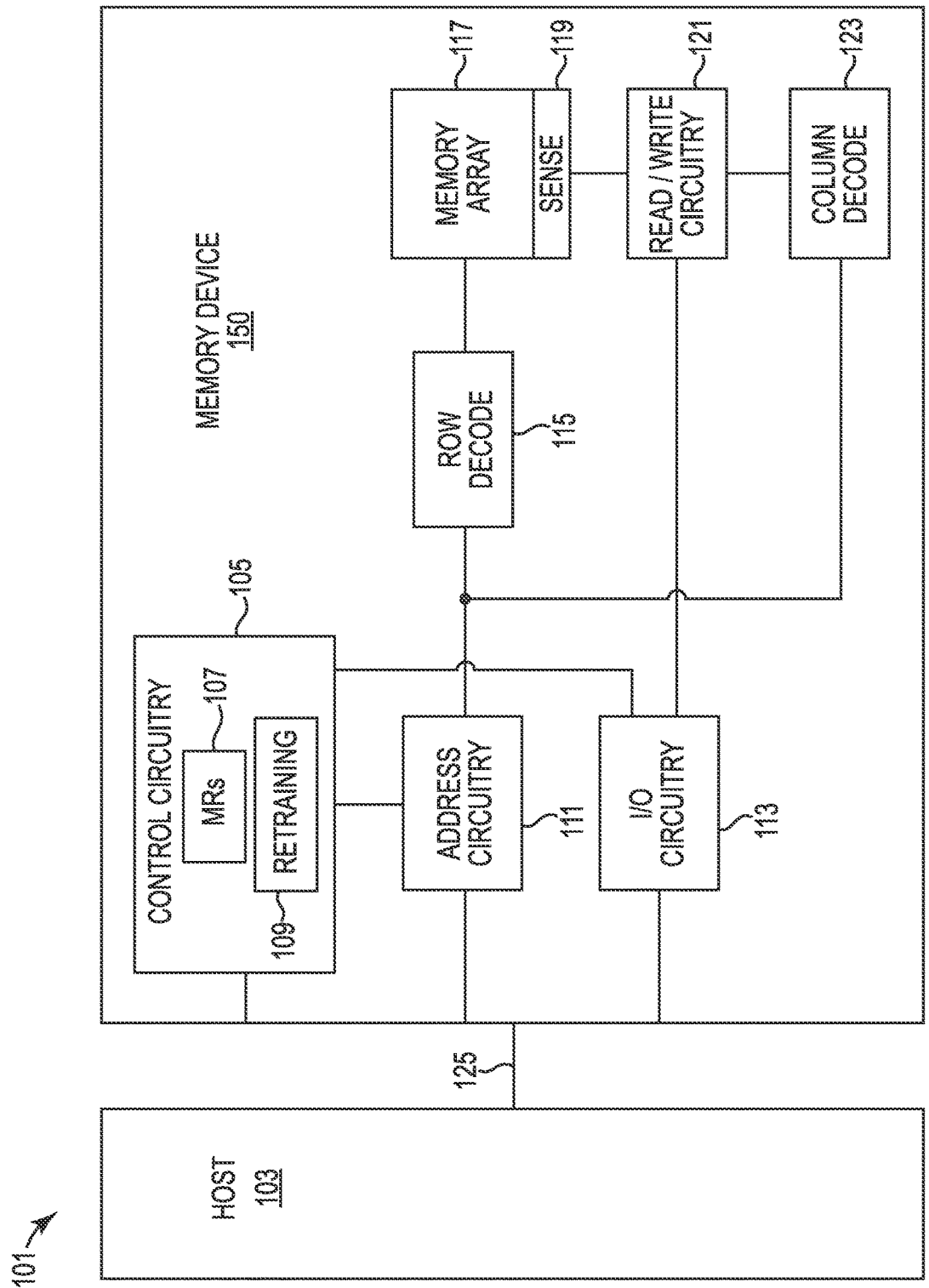
FIG. 1 is a block diagram of an apparatus in the form of a computing system including a memory device in accordance with a number of embodiments of the present disclosure.

Systems, devices, and methods related to memory device training are described. When a system with a memory device such as DRAM is powered up, the process can include the memory device powering up, initializing, calibrating a reference voltage (Vref), and training. A power up and initiation sequence is performed, calibration is started to set the Vref (e.g., using mode registers), and training begins to determine read and write delays to the memory device, center the data eye for reads, and report errors, among others.

However, as a temperature and voltage change on a memory device die, the data eye, command and address buses, and the internal Vref can shift, requiring re-training. Some approaches to memory device training include specific command sequences, patterns, or training result feedback mechanisms. The training sequence occurs at system power-on initialization, and some integrated circuits of the system may only support a one-time training. In such examples, read and write training may be supported, but implementation depends on a particular system-on-a-chip (SOC) design. Accuracy of periodic training in a memory device such as DRAM may be inaccurate or less accurate than other training types and may put the system at risk to freeze due to extra loading during a system idle stage.

Examples of the present disclosure can include autonomous training for memory, including DRAM and low-power DRAM in response to changes in temperature, power, or both. For instance, examples of the present disclosure allow for the use of pre-stored training configurations at different power (e.g., voltage) and temperature combinations, such that the autonomous training can be performed by looking up a stored training value and responding accordingly.

Examples of the present disclosure can include an apparatus comprising a memory device and a processing device communicatively coupled to the memory device. The processing device can perform a plurality of training rounds associated with performance of the memory device at different temperatures and different voltages, write results of the plurality of training rounds to a plurality of mode registers (MRs) of the memory device, and log an initial group identifier (GID) into a current GID MR (CGMR) as a reference identifier (ID). In response to a threshold deviation from the reference ID or in response to lack of deviation outside the threshold for a threshold amount of time, the processor can retrieve an updated training setting from the results in the plurality of mode registers, and the processor can enable the updated training setting.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the figure. Similar elements or components between different figures can be identified by the use of similar digits. For example, 430 can reference element "30" in FIG. 4, and a similar element can be referenced as 530 in FIG. 5. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a block diagram of an apparatus in the form of a computing system 101 including a memory device 150 in accordance with a number of embodiments of the present disclosure. The memory device 150 is coupled to a host 103 via an interface 125. As used herein, a host 103, a memory device 150, or a memory array 117, for example, might also be separately considered to be an "apparatus." The interface 124 can pass control, address, data, and other signals between the memory device 150 and the host 103. The interface 125 can include a command bus (e.g., coupled to the control circuitry 105), an address bus (e.g., coupled to the address circuitry 111), and a data bus (e.g., coupled to the input/output (I/O) circuitry 113). In some embodiments, the command bus and the address bus can be comprised of a common command/address bus. In some embodiments, the command bus, the address bus, and the data bus can be part of a common bus. The command bus can pass signals between the host 103 and the control circuitry 105 such as clock signals for timing, reset signals, chip selects, parity information, alerts, etc. The address bus can pass signals between the host 103 and the address circuitry 111 such as logical addresses of memory banks in the memory array 117 for memory operations. The interface 125 can be a physical interface employing a suitable protocol. Such a protocol may be custom or proprietary, or the interface 125 may employ a standardized protocol, such as Peripheral Component Interconnect Express (PCIe), Gen-Z interconnect, cache coherent interconnect for accelerators (CCIX), etc. In some cases, the control circuitry 105 is a register clock driver (RCD), such as RCD employed on an RDIMM or LRDIMM.

The memory device 150 and host 103 can be a satellite, a communications tower, a personal laptop computer, a desktop computer, a digital camera, a mobile telephone, a memory card reader, an Internet-of-Things (IoT) enabled device, an automobile, among various other types of systems. For clarity, the system 101 has been simplified to focus on features with particular relevance to the present disclosure. The host 103 can include a number of processing resources (e.g., one or more processors, microprocessors, or some other type of controlling circuitry) capable of accessing the memory device 150.

The memory device 150 can provide main memory for the host 103 or can be used as additional memory or storage for the host 103. By way of example, the memory device 150 can be a dual in-line memory module (DIMM) including memory arrays 117 operated as double data rate (DDR) DRAM, such as DDR5, a graphics DDR DRAM, such as GDDR6, or another type of memory system. Embodiments are not limited to a particular type of memory device 150. Other examples of memory arrays 117 include RAM, ROM, SDRAM, LPDRAM, PCRAM, RRAM, flash memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The control circuitry 105 can decode signals provided by the host 103. The control circuitry 105 can also be referred to as a command input and control circuit and can represent the functionality of different discrete ASICs or portions of different ASICs depending on the implementation. The signals can be commands provided by the host 103. These signals can include chip enable signals, write enable signals, and address latch signals, among others, that are used to control operations performed on the memory array 117. Such operations can include data read operations, data write operations, data erase operations, data move operations, etc. The control circuitry 106 can comprise a state machine, a sequencer, and/or some other type of control circuitry, which may be implemented in the form of hardware, firmware, or software, or any combination of the three. In some examples the control circuitry can include MRs 107).

Data can be provided to and/or from the memory array 117 via data lines coupling the memory array 117 to input/output (I/O) circuitry 113 via read/write circuitry 121. The I/O circuitry 113 can be used for bi-directional data communication with the host 103 over an interface. The read/write circuitry 121 is used to write data to the memory array 117 or read data from the memory array 117. As an example, the read/write circuitry 121 can comprise various drivers, latch circuitry, etc. In some embodiments, the data path can bypass the control circuitry 105.

The memory device 150 includes address circuitry 111 to latch address signals provided over an interface. Address signals are received and decoded by a row decoder 115 and a column decoder 123 to access the memory array 117. Data can be read from memory array 117 by sensing voltage and/or current changes on the sense lines using sensing circuitry 119. The sensing circuitry 112 can be coupled to the memory array 117. The sensing circuitry 119 can comprise, for example, sense amplifiers that can read and latch a page (e.g., row) of data from the memory array 117. Sensing (e.g., reading) a bit stored in a memory cell can involve sensing a relatively small voltage difference on a pair of sense lines, which may be referred to as digit lines or data lines.

The memory array 117 can comprise memory cells arranged in rows coupled by access lines (which may be referred to herein as word lines or select lines) and columns coupled by sense lines (which may be referred to herein as digit lines or data lines). Although the memory array 117 is shown as a single memory array, the memory array 117 can represent a plurality of memory arrays arraigned in banks of the memory device 150. The memory array 117 can include a number of memory cells, such as volatile memory cells (e.g., DRAM memory cells, among other types of volatile memory cells) and/or non-volatile memory cells (e.g., RRAM memory cells, among other types of non-volatile memory cells).

The control circuitry 105 can also include retraining circuitry 109. In some embodiments, the retraining circuitry 109 comprises an application specific integrated circuit (ASIC) configured to perform the training examples described herein. In some embodiments, the retraining circuitry 109 represents functionality of the control circuitry 105 that is not embodied in separate discrete circuitry. The term "controller" is used herein to refer to the functionality of the host 103, the control circuitry 105, and/or the retraining circuitry 109.

The controller can be configured to perform autonomous training in a memory device such as memory device 150. As temperature and voltage changes occur at the memory device 150, training can be updated, as will be discussed further herein.

Figure 2:
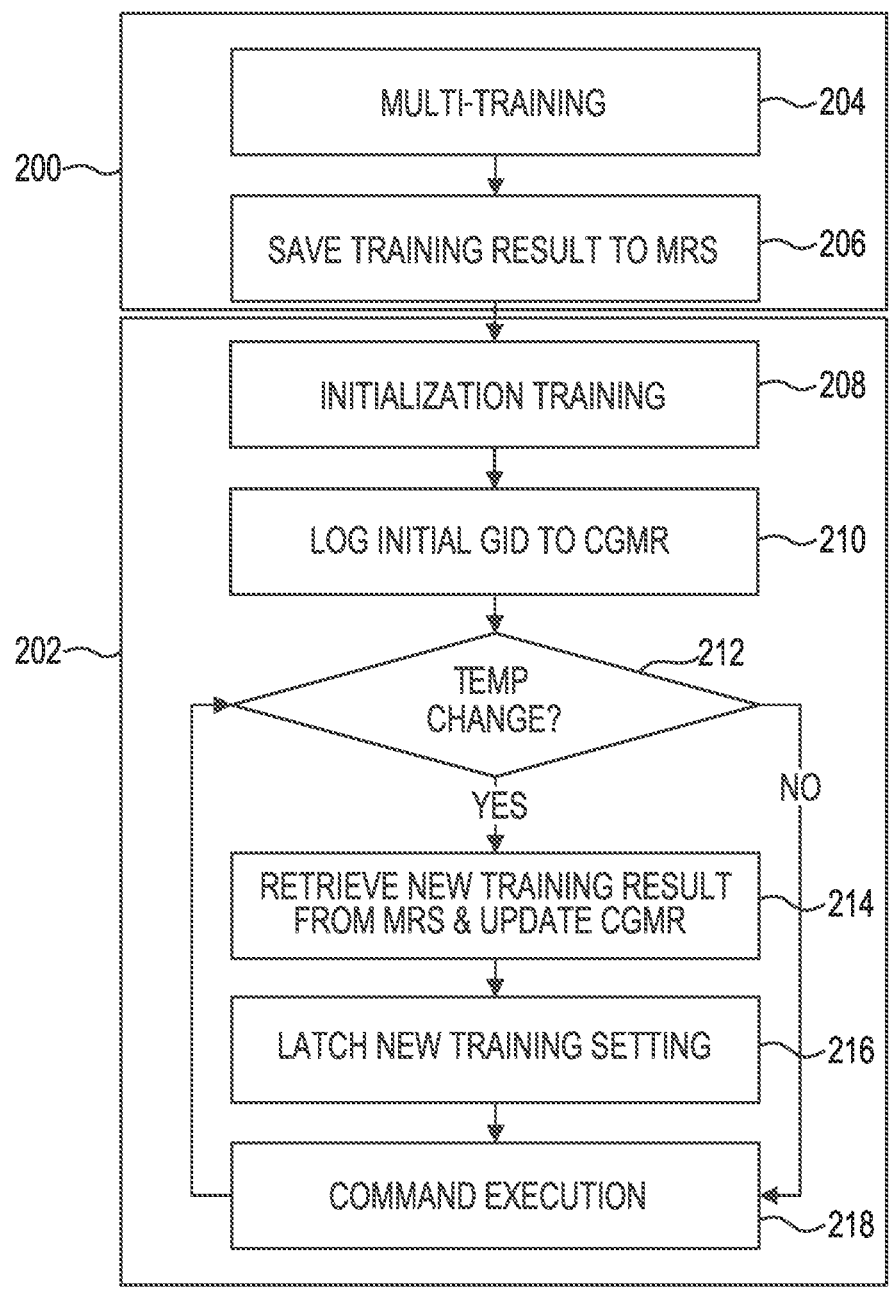
FIG. 2 is a flow chart representing a method for memory device training in accordance with a number of embodiments of the present disclosure.

FIG. 2 is a flow chart representing a method for memory device training in accordance with a number of embodiments of the present disclosure. FIG. 3 is a chart representing example group identifiers used in memory device training in accordance with a number of embodiments of the present disclosure. For ease of discussion, FIGS. 2 and 3 will be described together.

Memory device training (e.g., DRAM training, low-power DRAM training) can include retrieving pre-stored training configurations at different temperature and power combinations in response to a change in environment. For example, at 204, multiple-round trainings can be performed to determine various impacts from environmental changes. The multiple round trainings can be performed after manufacture of a memory device, but before it is shipped to a customer, for instance, and can determine appropriate reactions for the memory device for different temperature and power combinations.

Each different temperature and power combination may result in a value associated with a best reaction for the memory device to compensate for, adapt to, etc. the temperature and power combination. An example of GIDs for a low power double data rate standard (e.g., LPDDR5) memory device (e.g., DRAM) is illustrated in FIG. 3. Different temperatures are illustrated at 320, and different power levels (e.g., VDD2) are illustrated at 322. In the example, the nine different temperatures 320 and the six different power levels 322 result in 54 groups in the chart, each with its own GID. The result of each GID can be written to reserved MRs of the memory device subsequent to the multiple round training.

For instance, at 206, a training result of each GID can be written into reserved MRs of the memory device via a mode register write (MRW)/multipurpose command (MPC). The MRs can be non-volatile memory cells such that all of the GIDs can be saved in the memory device. The multi-training at 204 and the writing of the training results at 206 can be performed in-factory (e.g., during production) as indicated at 200, and the remaining elements may be performed in the field as indicated at 202. However, examples are not so limited. For example, the multiple round training can be performed in the field, as long as a GID can be accessed and saved to an MR. An end user, in some instances, can define a training stride (e.g., a learnable parameter) with a combination of different temperatures and powers. For instance, the multi-training at 204, the writing of the training results at 206, or both, can be modified or adjusted by users in the field in some examples. An example may include a user predefining a system load percentage and matching that to the table of GIDs based on a predicted change to the system load.

At 208, initialization training is performed. The training can include, for instance, power-up and initialization, command bus training, write leveling, Vref calibration, and read/write training, among others. For instance, the initialization training at 208 can include conventional power-on training based on initial tuning configurations.

A host SOC can log the initial GID into a dedicated MR (e.g., CGMR) as the original point for future temperature and/or power deviation judgment at 210. The CGMR can be compared and contrasted to a current setting, current voltage, and/or current temperature, and that information can be passed along to the memory device and host SOC for decision making.

At 212, a determination can be made if a temperature change occurred at the memory device. For example, the host SOC can periodically, continuously, near-continuously, etc. monitor a temperature of the memory device (Tj) using a memory device temperature sensor to determine whether to load a new training value from the MRs. For instance, autonomous training can be triggered when the temperatures shift of the memory device is above a particular threshold, reaching a temperature range other than the previous one covered by CGMR, or both. In some examples, autonomous training can be triggered when the temperature is within a particular range (e.g., stable) for a particular time period (e.g., 2 minutes, 5 minutes, 10 minutes, etc.).

In some instances, a sensor can be used to monitor a voltage of the memory device to determine if a change has occurred above a particular threshold, reaching a voltage range other than the previous one covered by CGMR, or both. In some examples, autonomous training can be triggered when the voltage is within a particular range (e.g., stable) for a particular time period (e.g., 2 minutes, 5 minutes, 10 minutes, etc.). Put another way, autonomous training can be triggered based on results of a temperature comparison, a voltage comparison, or both.

If, at 212, no threshold temperature change, threshold voltage change, or both is detected and/or stability has not been reached for a particular time period, a command can be executed at 218 by the memory device and/or host SOC. If, however, at 212, a threshold temperature change, threshold voltage change, or both is detected and/or stability has been reached for a particular time period, a new training result can be retrieved from the MRs, and the CGMR can be updated at 214.

For instance, prior to latching of a new training setting at 216, the host SOC can look up the target GID in the MRs and read out the setting value from the MR via a standard MR read (MRR) command. The host SOC can update the CGMR with the new GID. The latch operation at 216 can enable a desired training setting in the memory device such as timing, voltage, drive strength/on-die termination (ODT), etc. according to the new GID value. The host SOC may be responsible for enabling the new desired training setting on the SOC side. For instance, the host SOC may enable new training because the host gets the latest value based on the new temperature and/or voltage conditions and reconfigures a register on the host side (e.g., timing, OTD, etc.). The host SOC performs this first, followed by the memory device latching the training value.

In some examples, two modes of latching may be supported, including background latching and command-based latching. In a background mode, the memory device has the ability to know which group should be used as the proper training setting once a new GID is updated in CGMR. The memory device enables the new training settings automatically in background operation. A command-based latch is a multi-purposed command (MPC) initiated by the host SOC. A new command can be initiated by the host SOC, along with a new command to latch a new training value into the memory device. The new training value can take effect right after the latch at 216 allowing the host SOC to complete its register and reducing effects on the system and/or SOC from conditions changing. A command can be executed in response at 218 utilizing the new training values.

The priority of a new training value mode register read (MMR) and command-based latch can be lower than any other system commands received. If there is not enough time to complete the operation, the host SOC can find a different time to resume the process. If the system is still running, timing of the new register latch can be lower than the command sequence in the system so as not to interrupt the system for the register value latch. In such an example, system idle time can be utilized for these operations. The memory device and/or the host SOC can find an appropriate time to resume the latch process if the latch process was interrupted by the command operation.

When the command has been executed, further training ceases because training is not based on results of the command, so the training remains unchanged. The multiple round training at 204 allows for multiple combination possibilities resulting in improved accuracy of training values for different temperatures and voltages. In some instances, a mistake in production may result in changing of a training value after command execution.

Figure 4:
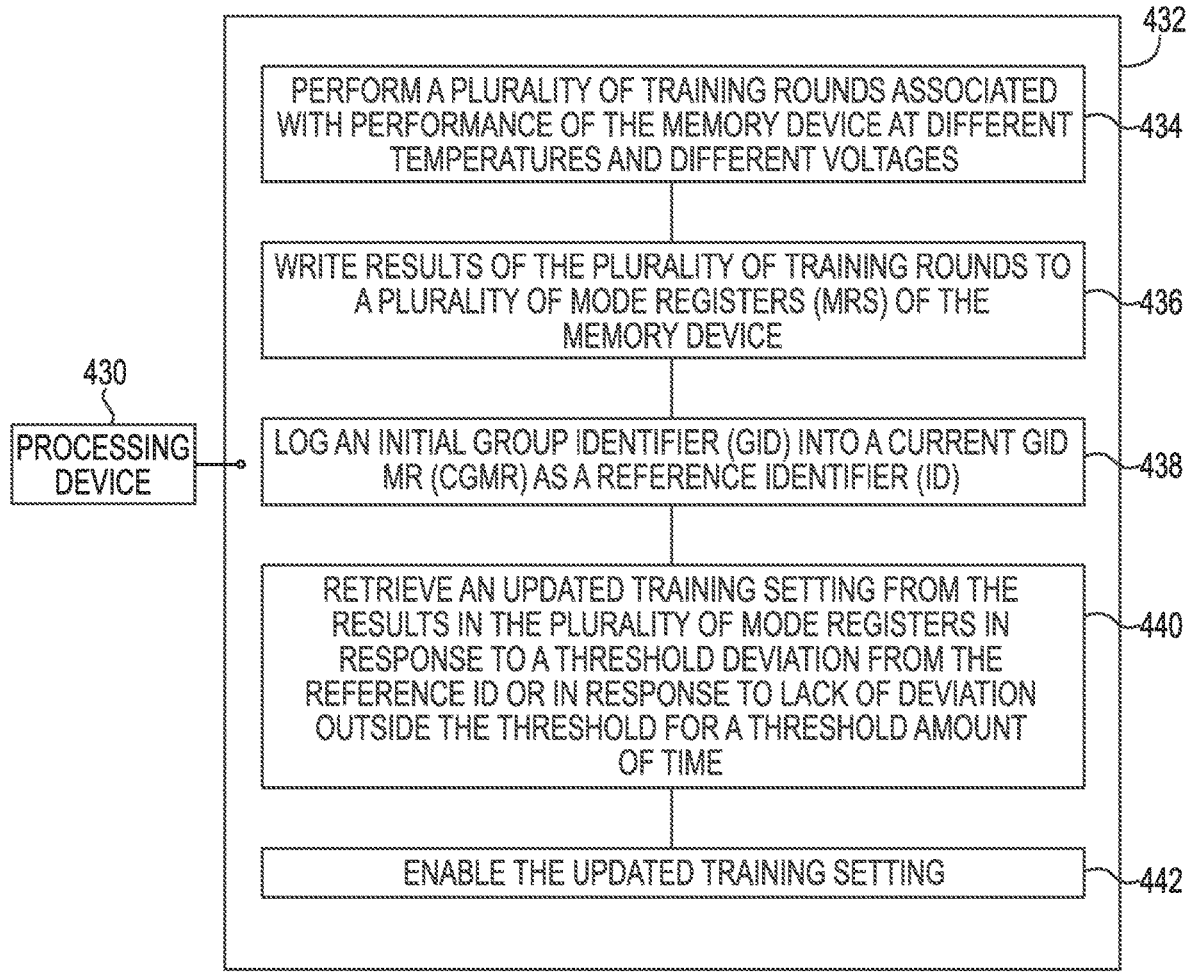
FIG. 4 is a functional diagram representing a processing device in communication with a memory device having instructions written thereon in accordance with a number of embodiments of the present disclosure.

FIG. 4 is a functional diagram representing a processing device 430 in communication with a memory resource 432 having instructions 434, 436, 438, 440, 442 written thereon in accordance with a number of embodiments of the present disclosure. The device illustrated in FIG. 4 can be a server or a computing device (among others) and can include the processing device 430. The device can further include the memory resource 432 (e.g., a non-transitory MRM), on which may be stored instructions, such as instructions 434, 436, 438, 440, 442. The device, in some examples, may be analogous to the device described with respect to FIG. 5 including processing devices 530 and memory resource 532. Although the following descriptions refer to a processing device and a memory device, the descriptions may also apply to a system with multiple processing devices and multiple memory devices. In such examples, the instructions may be distributed (e.g., stored) across multiple memory devices and the instructions may be distributed (e.g., executed by) across multiple processing devices.

The memory resource 432 may be electronic, magnetic, optical, or other physical storage device that stores executable instructions. Thus, the memory resource 432 may be, for example, non-volatile or volatile memory. In some examples, the memory resource 432 is a non-transitory MRM comprising RAM, an Electrically-Erasable Programmable ROM (EEPROM), a storage drive, an optical disc, and the like. The memory resource 432 may be disposed within a controller and/or computing device. In this example, the executable instructions 434, 436, 438, 440, 442 can be "installed" on the device. Additionally, and/or alternatively, the memory resource 432 can be a portable, external or remote storage medium, for example, that allows the system to download the instructions 434, 436, 438, 440, 442 from the portable/external/remote storage medium. In this situation, the executable instructions may be part of an "installation package". As described herein, the memory device 450 can be encoded with executable instructions for memory device training.

The instructions 434, when executed by a processing device such as the processing device 430 can include instructions to perform a plurality of training rounds associated with performance of the memory device at different temperatures and different voltages. The training can include determining particular training values/settings for each temperature and voltage combination that allows the memory device to perform as desired (e.g., greatest efficiency). The memory device can be a DRAM device, and in some examples can be a low-power DRAM device. The plurality of training rounds can be performed in the field, during production of the memory device, or both.

The instructions 436, when executed by a processing device such as the processing device 430, can cause results of the plurality of training rounds to be written to a plurality of MRs of the memory device. In some examples, each one of the plurality of MRs is a non-volatile memory cell such that GID values can be saved to the memory device. The results of the plurality of training rounds can be written in the field, during production of the memory device, or both.

The instructions 438, when executed by a processing device such as the processing device 430, can cause an initial GID to be logged into a CGMR as a reference ID. The CGMR can act as a starting point for future temperature and/or voltage deviation judgment. As temperature and/or voltage changes, the CGMR can be referenced as a starting point and original setting.

The instructions 440, when executed by a processing device such as the processing device 430, can cause an updated training setting to be retrieved from the results in the plurality of MRs in response to a threshold deviation from the reference ID or in response to lack of deviation outside the threshold for a threshold amount of time. For instance, if the memory device environment changes such that the temperature, voltage, or both falls outside a threshold (e.g., too high, too low, etc.), updated training settings correlating to the new conditions can be retrieved from the MRs. In some instances, if the memory device environment has been stable (e.g., within a threshold temperature and/or voltage range), for a particular period of time (e.g., 5 minutes, 10 minutes, etc.), updated training settings can also be retrieved from the MRs to keep training updated. In some examples, the processing device 430 can update the CGMR as an updated reference ID responsive to retrieval of the updated training setting. For instance, if the temperature changes enough to trigger retrieval of a new training setting, that new training setting is used to update the CGMR to the updated reference ID that will act as a reference point for a future memory device environmental change or threshold stability.

The instructions 442, when executed by a processing device such as the processing device 430, can cause the updated training setting to be enabled. For instance, once the updated training setting is retrieved, the setting can be enabled to reduce and/or delay performance interruptions in the memory device. The memory device can proceed to execute commands considering the updated training setting.

Figure 5:
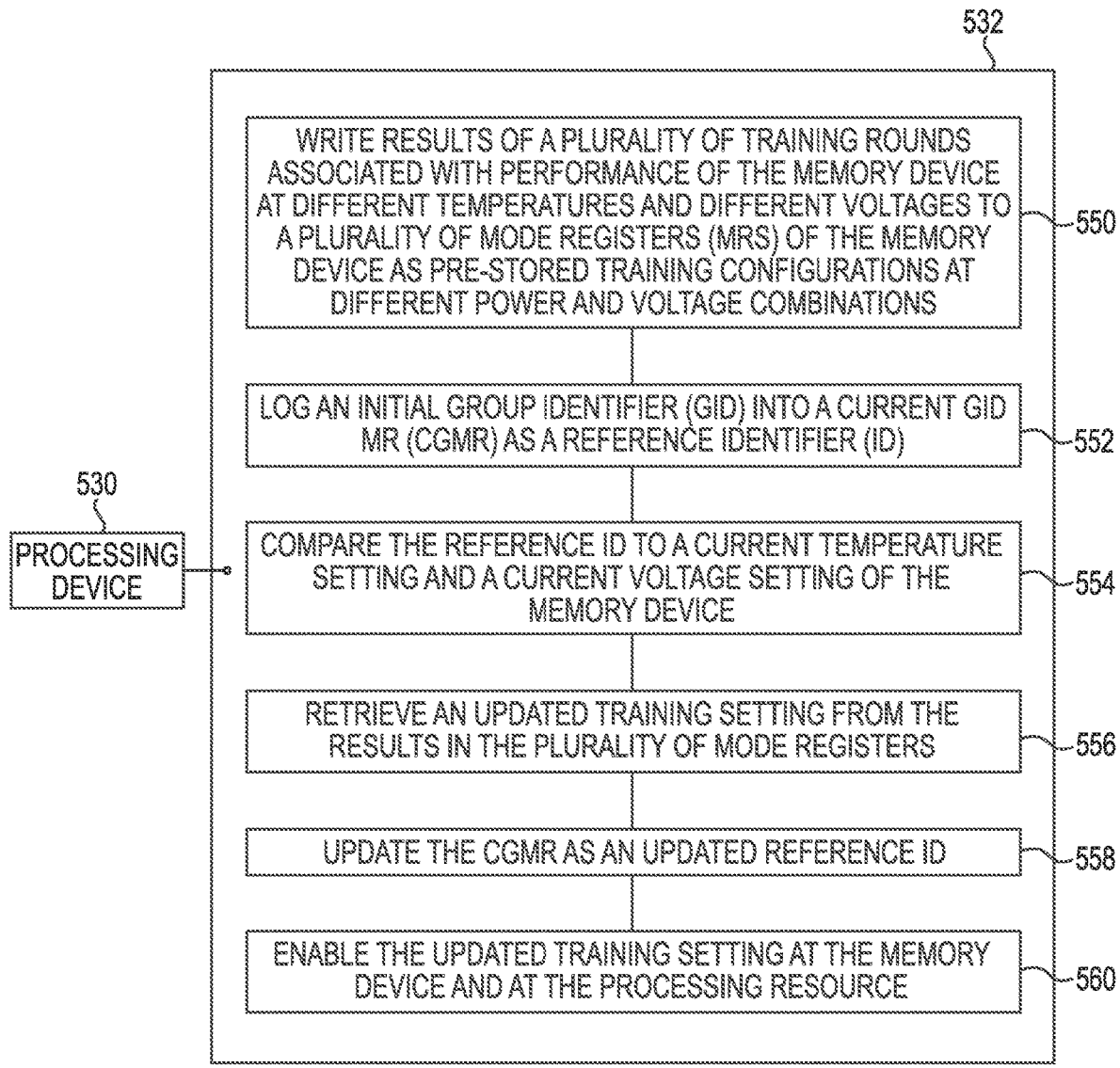
FIG. 5 is another functional diagram representing a processing device in communication with a memory device having instructions written thereon in accordance with a number of embodiments of the present disclosure.

FIG. 5 is another functional diagram representing a processing device 530 in communication with a memory resource 532 having instructions 550, 552, 554, 556, 558, 560 written thereon in accordance with a number of embodiments of the present disclosure. In some examples, the processing device 530 and the memory resource 532 comprise a device and may be analogous to the processing device 430 and the memory resource 432 illustrated in FIG. 4.

The instructions 550, when executed by a processing device such as the processing device 530, can cause results of a plurality of training rounds associated with performance of the memory device at different temperatures and different voltages to be written to a plurality of MRs of the memory device as pre-stored training configurations at different power and voltage combinations. Multiple round training results can include GIDs to identify the pre-stored training configurations, where each GID can represent a configuration to best compensate for impacts from external environmental changes at particular temperature and voltage combinations.

The instructions 552, when executed by a processing device such as the processing device 530, can cause an initial GID to be logged into a CGMR as a reference ID. For instance, the CGMR can act as a starting point for comparing changing environment conditions experienced by the memory device. The instructions 554, when executed by a processing device such as the processing device 530 can include instructions to compare the reference ID to a current temperature setting and a current voltage setting of the memory device. For instance, the processing device 530 can continuously monitor a current temperature and a current voltage of the memory device using a sensor. The current temperature and/or current voltage can be compared to the reference ID, and based on the results, updated training may be triggered.

The instructions 556, when executed by a processing device such as the processing device 530, can cause an updated training setting to be retrieved from the results in the plurality of MRs based on the comparison and in response to a threshold deviation from the reference ID or in response to lack of deviation outside the threshold for a threshold amount of time. For instance, if the current temperature detected by a sensor is higher than that of the reference ID, an updated training setting can be retrieved to allow for desired performance in the new environmental conditions. Additionally or alternatively, if the voltage remains the same after a threshold period of time, an updated training setting (which may be the same GID), can be retrieved from the plurality of MRs. This allows for the most up-to-date settings for the memory device.

The instructions 558, when executed by a processing device such as the processing device 530, can cause the CGMR to be updated as an updated reference ID. For example, the GID associated the higher temperature may be used to update the CGMR. This because the updated reference ID and can be used as the comparison point for environmental condition changes or stretches of stability.

The instructions 560, when executed by a processing device such as the processing device 530, can cause the updated training setting to be enabled at the memory device and at the processing device 530. The updated training setting can be automatically enabled, in some examples, as a background operation. In other examples, the processing device 530 can create a multi-purposed command to enable the updated training setting. A host SOC may be used to trigger or latch the updated training data to the memory device in some examples.

In some examples, the memory device can include an event recorder storage device for an autonomous vehicle. For instance, as the environment changes around the event recorder storage device, the storage device (e.g., DRAM, low-power DRAM, etc.) can undergo autonomous training, such that the autonomous vehicle performs as desired with reduced interruptions.

Figure 6:
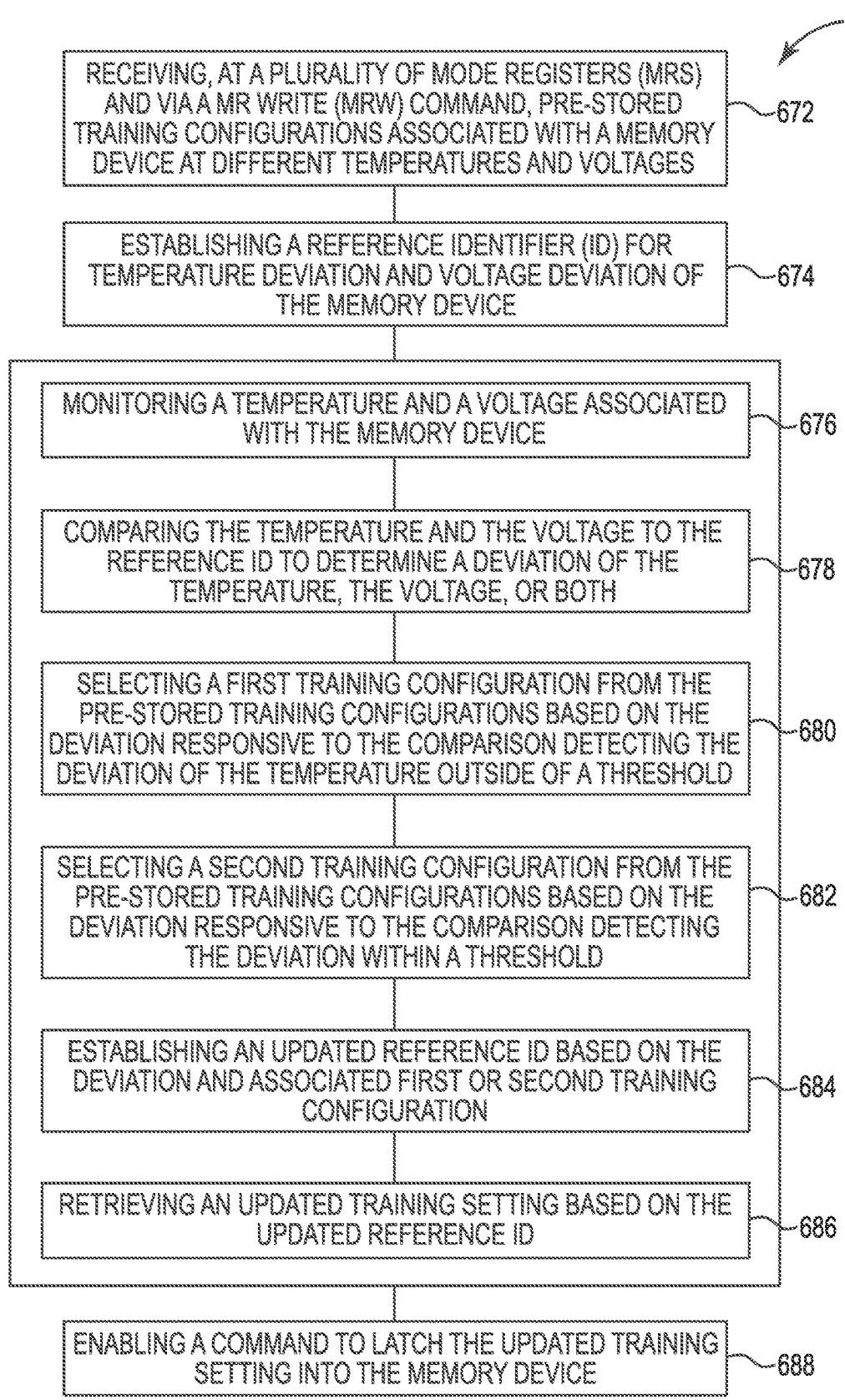
FIG. 6 is a flow diagram representing an example method for memory device training in accordance with a number of embodiments of the present disclosure.

FIG. 6 is a flow diagram representing an example method 670 for memory device training in accordance with a number of embodiments of the present disclosure. The method 670 may be performed, in some examples, using a device such as those described with respect to FIGS. 4 and 5. The method can include memory device (e.g., DRAM, low-power DRAM) training including retrieval of pre-stored training configurations at different temperature and power combinations after an application environment is altered.

The method 670, at 672, can include receiving, at a plurality of MRs and via a MR write (MRW) command, pre-stored training configurations associated with a memory device at different temperatures and voltages. In some examples, the pre-stored training configurations can be determined by performing a plurality of training rounds associated with performance of the memory device. The training rounds can be performed during a boot sequence. The pre-stored training configurations can be stored in the plurality of MRs as GIDs, with each GID associated with a particular temperature and voltage combination. The pre-stored training configurations in the MRs may not be modified, but for mistakes during production, which can result in modifications performed in the field.

At 674, the method 670 can include establishing a reference ID for temperature deviation and voltage deviation of the memory device. A host SOC can log an initial GID into a dedicated MR known as a CGMR as an original point for future temperature and voltage deviation judgment. At 676, the method 670 can include monitoring a temperature and a voltage associated with the memory device, and at 678, can include comparing the temperature and the voltage to the reference ID to determine a deviation of the temperature, the voltage, or both. The host SOC can regularly monitor the memory device die temperature and voltage using a sensor to determine whether a new training value from the plurality of MRs should be loaded. For instance, determinations can be made if the temperature and/or voltage have deviated by a threshold amount, or if they have remained stable for a threshold amount of time, among other determinations.

At 680, the method 670 can include selecting a first training configuration from the pre-stored training configurations based on the deviation responsive to the comparison detecting the deviation of the temperature outside of a threshold. For instance, the first training configuration can include a temperature and voltage combination correlating to the new temperature detected outside of the threshold covered by the CGMR.

At 682, the method 670 can include selecting a second training configuration from the pre-stored training configurations based on the deviation responsive to the comparison detecting the deviation within the threshold. For example, the second training configuration can include a temperature and voltage combination correlating to the temperature of the reference ID; that is, the GID may not change from the ranges covered by the CGMR. However, by updating the reference ID, even if it is updated to the same reference ID, allows for a most updated training for the memory device.

The method 670, at 684, can include establishing an updated reference ID based on the deviation and associated first or second training configuration, and at 686, the method 670 can include retrieving an updated training setting based on the updated reference ID. For instance, the host SOC can look up a target GID in the MRs, read out the setting value from the RM via a MRR command, and update the CGMR with the new GID. This can enable a desired training setting in the memory device according to the new GID value. In some examples, the method 670 can include establishing the updated reference ID for drive strength deviation and comparing a drive strength to the updated reference ID to a determined deviation of the drive strength of the memory device. The host SOC can enable the new training setting in the SOC side in addition to the memory device side.

The elements 676-686, in some examples, can be performed iteratively. For instance, as the environment of the memory device changes, GIDs and CGMRs can be updated such that the memory device can adapt and perform as desired in the environment. The memory device can undergo autonomous training by iteratively monitoring temperature and voltages and update training settings as the temperature and/or voltages change, as well as after particular periods of temperature and/or voltage stability.

The method 670, at 688, can include enabling a command to latch the updated training setting into the memory device. The latch can include a background latch or a command-based latch, and the new training setting can take effect upon completion of the latch. The priority of the new training value MRR (e.g., background latch) and the command-based latch can be lower than other system commands received. If there is not enough time to complete the latch operation, the host SOC can find an appropriate time to resume to the latch process. For instance, the command can be enabled during an idle time of the memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device; and
a processing device communicatively coupled to the memory device, wherein the processing device is configured to:
perform a plurality of training rounds associated with performance of the memory device at different temperatures and different voltages;
write results of the plurality of training rounds to a plurality of mode registers (MRs) of the memory device;
log an initial group identifier (GID) into a current GID MR (CGMR) as a reference identifier (ID);
in response to a threshold deviation from a temperature, a voltage, or both associated with the reference ID, retrieve an updated training setting from the results in the plurality of mode registers;
in response to lack of deviation outside the threshold for a threshold amount of time, retrieve the updated training setting from the results in the plurality of mode registers; and
enable the updated training setting.

2. The apparatus of claim 1, further comprising the processing device to update the CGMR as an updated reference ID responsive to retrieval of the updated training setting.

3. The apparatus of claim 1, wherein each one of the plurality of MRs is a non-volatile memory cell.

4. The apparatus of claim 1, wherein the memory device is a dynamic random-access memory (DRAM) device.

5. The apparatus of claim 4, wherein the DRAM device is a low-power DRAM device.

6. The apparatus of claim 1, wherein the processing device is configured to perform the plurality of training rounds during production of the memory device.

7. The apparatus of claim 1, wherein the processing device is configured to perform the plurality of training rounds in the field.

8. The apparatus of claim 1, wherein the processing device is configured to write the results of the training rounds during production of the memory device.

9. The apparatus of claim 1, wherein the processing device is configured to write the results of the training rounds in the field.

10. An apparatus, comprising:
a memory device; and
a processing device communicatively coupled to the memory device, the processing device to:
write results of a plurality of training rounds associated with performance of the memory device at different temperatures and different voltages to a plurality of mode registers (MRs) of the memory device as pre-stored training configurations at different power and voltage combinations;
log an initial group identifier (GID) into a current GID MR (CGMR) as a reference identifier (ID);
compare a temperature and a voltage associated with the reference ID to a current temperature setting and a current voltage setting of the memory device;
based on the comparison and in response to a threshold deviation from the temperature, voltage, or both associated with the reference ID, retrieve an updated training setting from the results in the plurality of mode registers and update the CGMR as an updated reference ID;
based on the comparison and in response to lack of deviation outside the threshold for a threshold amount of time, retrieve the updated training setting from the results in the plurality of mode registers and update the CGMR as the updated reference ID; and
enable the updated training setting at the memory device and at the processing device.

11. The apparatus of claim 10, further comprising the processing device to continuously monitor the current temperature and the current voltage of the memory device using a sensor.

12. The apparatus of claim 10, wherein the memory device is an event recorder storage device of an autonomous vehicle.

13. The apparatus of claim 10, wherein the processing device is configured to automatically enable the updated training setting as a background operation.

14. The apparatus of claim 10, wherein the processing device is configured to create a multi-purposed command to enable the updated training setting.

15. A method, comprising:
receiving, at a plurality of mode registers (MRs) and via a MR write (MRW) command, pre-stored training configurations associated with a memory device at different temperatures and voltages;
establishing a reference identifier (ID) for temperature deviation and voltage deviation of the memory device;
iteratively:
monitoring a temperature and a voltage associated with the memory device;
comparing the temperature and the voltage to the reference ID to determine a deviation of the temperature, the voltage, or both;
responsive to the comparison detecting the deviation of the temperature outside of a threshold, selecting a first training configuration from the pre-stored training configurations based on the deviation;
responsive to the comparison detecting the deviation within a threshold for a threshold amount of time, selecting a second training configuration from the pre-stored training configurations based on the deviation; and
establishing an updated reference ID based on the deviation and associated first or second training configuration;
retrieving an updated training setting based on the updated reference ID; and
enabling a command to latch the updated training setting into the memory device.

16. The method of claim 15, further comprising determining the pre-stored training configurations by performing a plurality of training rounds associated with performance of the memory device.

17. The method of claim 16, further comprising performing the plurality of training rounds during a boot sequence.

18. The method of claim 15, further comprising modifying the pre-stored training configurations in the MRs in the field.

19. The method of claim 15, further comprising enabling the command during an idle time of the memory device.

20. The method of claim 15, further comprising establishing the reference ID for drive strength deviation and comparing a drive strength to the reference ID to a determined deviation of the drive strength of the memory device.

* * * * *